(12) United States Patent
Pearce et al.

(10) Patent No.: US 6,245,692 B1
(45) Date of Patent: Jun. 12, 2001

(54) METHOD TO SELECTIVELY HEAT SEMICONDUCTOR WAFERS

(75) Inventors: Charles Walter Pearce, Emmaus; Michael Steven Billig, Palmerton, both of PA (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/448,349

(22) Filed: Nov. 23, 1999

(51) Int. Cl.[7] .................................................. H01L 21/26
(52) U.S. Cl. ............................................. 438/795; 438/584
(58) Field of Search .................................. 438/478, 584, 438/795, 745, 959, 5, 22

(56) References Cited

U.S. PATENT DOCUMENTS

| | | | |
|---|---|---|---|
| 3,836,745 | * 9/1974 | Costello | 219/85 |
| 5,382,551 | 1/1995 | Thakur et al. | |
| 5,508,934 | 4/1996 | Moslehi et al. | 364/468 |
| 5,561,612 | 10/1996 | Thakur | 364/557 |
| 5,654,904 | * 8/1997 | Thankur | 364/557 |
| 5,851,929 | 12/1998 | Thakur et al. | 438/795 |
| 5,861,609 | 1/1999 | Kaltenbrunner et al. | 219/390 |
| 6,074,087 | * 6/2000 | Chen et al. | 374/129 |

OTHER PUBLICATIONS

Nenyei et al., Defect–Guarded Rapid Thermal Processing, J. Electrochem. Soc., vol. 140, No. 6, Jun. 1993, pp. 1728–1733.

Kakoschke, Temperature Problems with Rapid Thermal Procesing for VLSI Applications, VII. Emerging Processes for VLSI, pp. 753–759.

* cited by examiner

Primary Examiner—David Nelms
Assistant Examiner—David Nhu
(74) Attorney, Agent, or Firm—Schnader Harrison; Segal & Lewis LLP

(57) ABSTRACT

A method for manufacturing integrated circuits; particularly, a method to alter heat flow on a localized basis, when heating wafers to elevated temperatures, to achieve different processing temperatures by altering the material properties, such as emissivity, absorptivity and reflectivity, of a portion of a surface by the application of thin films of various materials.

20 Claims, 3 Drawing Sheets

METHOD TO SELECTIVELY HEAT SEMICONDUCTOR WAFERS

BACKGROUND OF THE INVENTION

1. Field of the Invention

This invention relates to a method of manufacturing semiconductor integrated circuit interconnect structures. The invention relates more particularly to a method to alter heat flow on a localized basis when heating wafers to elevated temperatures to achieve different processing temperatures by altering the material properties, such as emissivity, absorptivity, and reflectivity, of a portion of a surface by the application of thin films of specified materials.

2. Background of the Invention

A. Field of the Invention

This invention relates to a method for fabricating semiconductor integrated circuit devices, specifically with a method for fabricating semiconductor integrated circuit devices enabling the creation of temperature differentials.

B. Description of the Related Art.

Semiconductor integrated circuit devices typically comprise silicon and multiple layers of vertically stacked metal interconnect layers with dielectric materials disposed between them. The fabrication of such devices typically involves the repeated deposition or growth, patterning, and etching of thin films of semiconductor, metal, and dielectric materials.

A substantial part of integrated device manufacture involves heating the wafers to elevated temperatures to promote a particular chemical reaction or to anneal the structure to achieve a desired metallurgical effect.

Typically, batch furnaces are used to heat silicon-based semiconductors during thermal fabrication steps. The furnaces heat primarily by radiation such that the wafers are in thermal equilibrium with the furnace surroundings. For example, as shown in FIG. 1, a batch furnace 10 may include a quartz tube 1 inserted into the core 2 of a furnace 3 that is heated resistively, where gas flows through the tube 1. Wafers 4 are placed inside the tube 1 and pushed into the core 2, where a uniform temperature is maintained. The heating elements 5 heat the core 2 and the wafers 4 with long-wavelength thermal radiation. Many wafers may be processed simultaneously and the cost of operation is divided among the number of wafers in the batch. A problem with using a furnace is that the wafers are susceptible to contamination from the hot processing in the core 2 on which deposited films may accumulate and flake off or through which impurities may diffuse and contaminate wafers 4.

Microprocessing environments for single wafers are now being used since control of contamination, process parameters, and reduced manufacturing costs are desired. In particular, rapid thermal processing (RTP) using transient lamp heating allows thermal processing to occur in a closed microenvironment. A rapid thermal processor 20 is shown in FIG. 2. A single wafer 11 is heated quickly under atmospheric conditions or at low pressure. The processing chamber 12 is either made of quartz, silicon carbide, stainless steel, or aluminum and has quartz windows 13 through which the optical radiation passes to illuminate the wafer 11. The wafer 11 is held, usually on thin quartz pins 18, in thermal isolation inside chamber 12. An ambient atmosphere inside chamber 12 is controlled by gas flow through chamber 12. Gas flows into the chamber 12 at gas inlet 14. Lamps 15 heat the wafer 11 through windows 13, aided by reflectors 17 above the lamps 15. A measurement system is placed in a control loop to set wafer temperature. Typically, an optical pyrometer 16 determines the temperature from radiated infrared energy on the back of the wafer 11, but thermocouples can also be used. The RTP system is interfaced with a gas-handling system and a computer that controls system operation.

The transfer of heat between objects is a function of their emissivity and absorptivity. For example, a perfect radiator or absorber has an emissivity of 1.0, whereas metals have much lower values around 0.1. Heat flow and emissivity are related by the following equation:

$$Q = \epsilon \sigma T^4$$

where Q is total heat flow in $W/m^2$, $\epsilon$ is emissivity, $\sigma$ is the Stefan Boltzmann radiation constant of $5.67 \times 10^{-8}$ $W/m^2 {}^\circ K^4$, and T is the temperature in $^\circ K$.

In many cases, there are competing reactions occurring and it is desirable for these reactions to occur at different temperatures. Thus, to the extent the emissivity of a surface can be altered on a localized basis, a temperature differential can be achieved.

A method is known to apply a thin film on a surface to control reflectivity and emissivity. This film is applied to a wafer in a rapid thermal processor to alter the energy exchange. This method does not address selective application of film on the wafer to alter the temperature.

Another method is known for applying a film onto a substrate of a semiconductor, heating the substrate, and removing the layer. This method is used for reducing the effects of semiconductor deformities and does not address temperature differences in heating the wafer.

As a result, it is desirable to have a method that alters emissivity of selected portions of a surface to achieve a temperature differential.

SUMMARY OF THE INVENTION

The invention is a method of manufacturing an integrated circuit including the steps of: (1) providing a wafer having a surface; (2) altering material properties, such as emissivity, absorptivity, and reflectivity, of at least one selected portion of the surface to alter heat flow in the portion by depositing at least one layer of film on the portion; (3) heating the wafer to an elevated temperature to initiate a reaction at the portion; and (4) monitoring the temperature of the wafer and terminating the heating when a predetermined period of time has expired.

DETAILED DESCRIPTION

The invention will be understood more fully from the detailed description given below, which however, should not be taken to limit the invention to a specific embodiment, but is for explanation and understanding only.

Figure 1:
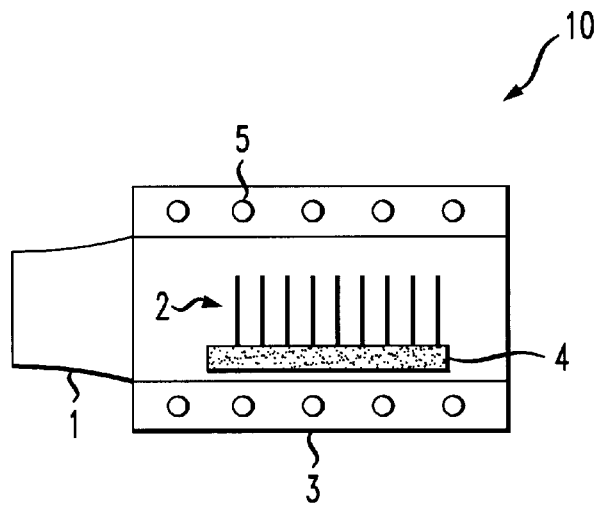
FIG. 1 is a schematic cross-sectional view of a batch-furnace system used to heat wafers.
Figure 2:
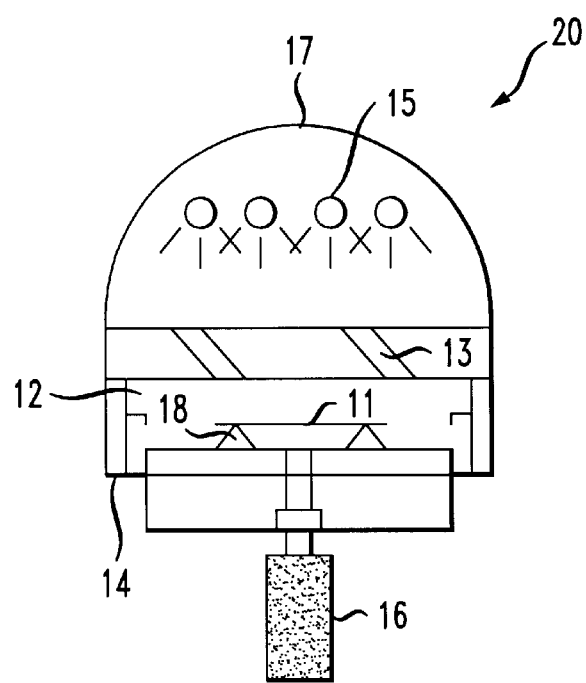
FIG. 2 is a schematic cross-sectional view of a rapid thermal processing system used to heat a single wafer.
Figure 3:
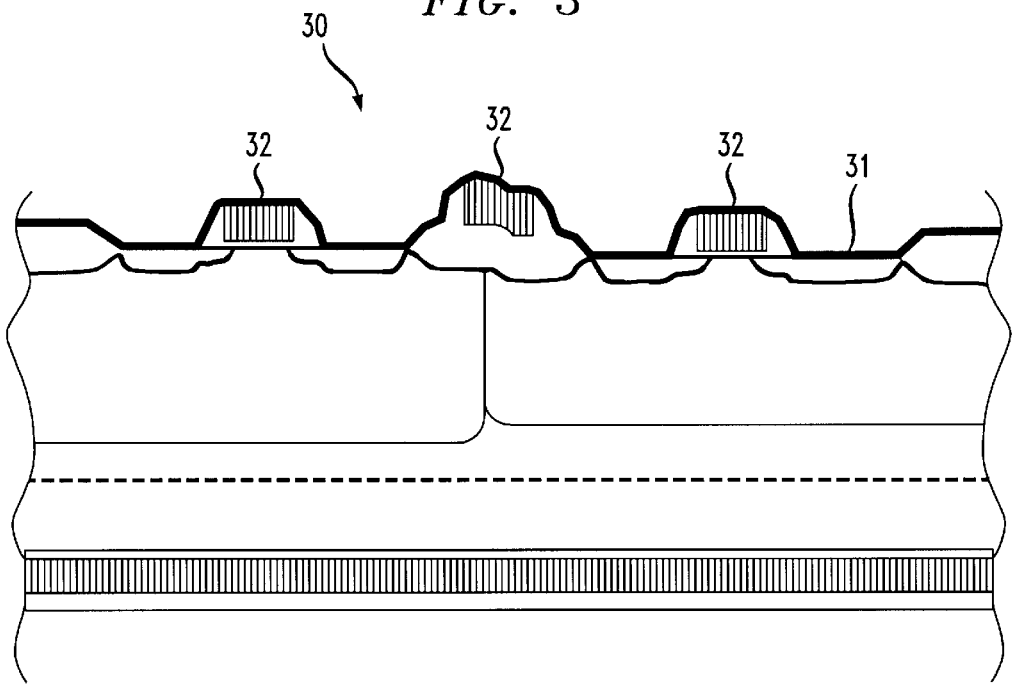
FIG. 3 is a cross-sectional view of a portion of an integrated circuit.
Figure 4:
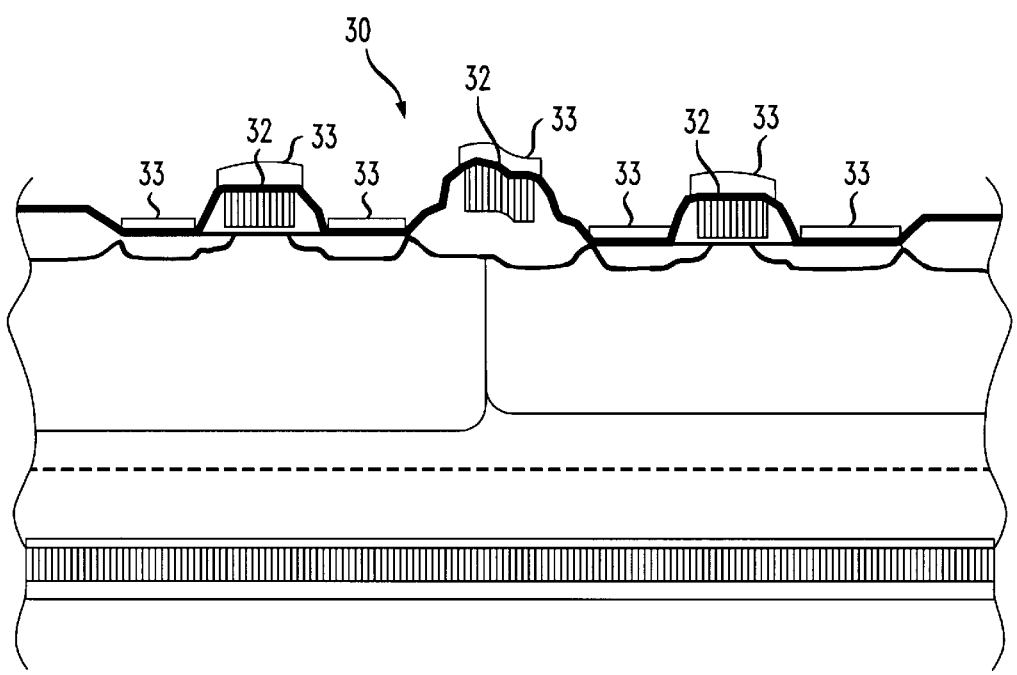
FIG. 4 is a schematic cross-sectional view of a portion of the integrated circuit shown in FIG. 3 manufactured in accordance with the method of the invention.

FIGS. 3 and 4 illustrate aportion of an integrated circuit, which is manufactured in accordance with the method of invention. As shown in FIG. 3, the components of an integrated circuit include a wafer 30 having a surface 31 and selected portions 32 of the surface 31, where a chemical reaction or physical reaction, such as annealing, sintering, or diffusion, may occur in a rapid thermal processor (RTP), or other type of heater. In FIG. 4, the wafer 30 has layers of film 33 deposited on the selected portions 32.

The method of the invention includes manufacturing an integrated circuit including the steps of; (1) providing a wafer 30 having a surface 31, as shown in FIG. 3; (2) altering material properties, such as emissivity, absorptivity, and reflectivity, of at least one selected portion 32 of the surface 31 to alter heat flow in the portion 32 by depositing at least one layer of film 33 on the portion 32, as shown in FIG. 4; (3) heating the wafer 30 to an elevated temperature to initiate a reaction at the portion 32; and (4) monitoring the temperature of the wafer 30 to control the heating and terminating the heating when a predetermined period of time has expired.

While not completely understood, it is believed that a film will alter the energy or heat flow inside the RTP, dependent upon the physical characteristics of the film or compound with those of the surrounding media. The net heat transfer to the surface is expected to be a function of a material's emissivity ($\epsilon$), absorptivity ( ), and reflectivity ($\gamma$) where $\epsilon + \gamma + = 1$. By careful choice of film properties subject to physical constraints like the above equation, the film 33 can be made to cause the selected portion of the wafer 30 to be relatively hotter or colder than the surrounding portion ofthe wafer during the RTP process. Although, in many cases, the desired result will be selective heating as opposed to selective cooling. For example, the heat flow can be characterized by the equation:

$$Q = \epsilon_e \sigma (T_s^4 - T_p^4)$$

where $T_s$ is the source temperature, $T_p$ is the temperature of a portion of the wafer, and $\epsilon_e$ is the effective emissivity of a system comprised of a heat source of emissivity, $\epsilon_{s3}$ and an emissivity of the portion, $\epsilon_p$, and is characterized by the equation:

$$\epsilon_e = \frac{1}{1/\epsilon_s + 1/\epsilon_p - 1}$$

It is believed that to the extent $\epsilon_p$ can be varied on a local basis, localized heating can be obtained.

Figure 5:
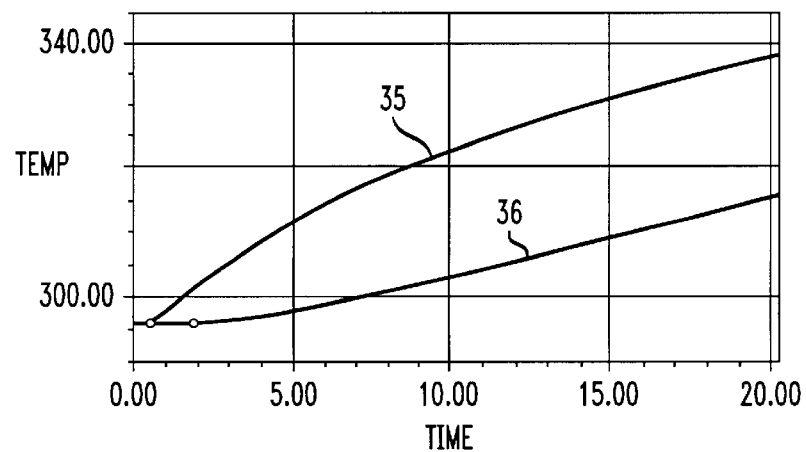
FIG. 5 is a graph of wafer temperature versus time for a wafer with a deposited film (a) and a wafer without a deposited film (b).

The temperature differential, shown in FIG. 5 by a graph of temperature versus time, is derived from the above equations.

For example, when a metal film having an emissivity of 0.1 is deposited on a wafer, a silica film having an emissivity of 0.6 is placed selectively on top of the metal film, and the wafer is heated by a heating source at 1600° K, the temperature of the surface with the film at a given time, shown by curve 35, is greater than the temperature of a surface without the film at the same given time, shown by curve 36. After about 20 seconds of heating, the temperature on curve 35 is about 338° K and the corresponding temperature on curve 36 is about 316° K, producing a temperature differential of about 22° K. Thus, the heat flow at the surface with the silica film is greater, and while not completely understood, it is believed that the reaction under the film will occur at a different processing temperature than any reaction occurring on the surface without the film. This result was found to agree with an experiment described below using selected films of titanium on silicon. It is also believed that this heating requires less time to produce higher temperatures at various portions on the surface of the wafer. It should be realized that any practical situation may involve a more elaborate theoretical explanation involving the thickness of applied films and their thermal conductivity.

The film may be deposited by low pressure chemical vapor deposition, plasma-enhanced chemical vapor deposition, sputtering, spin-on-glass, molecular beam epitaxy, physical vapor deposition, or combinations thereof Preferably, the film is deposited on the front of the wafer. Since most of the heat transfer takes place at relatively long wavelengths characteristic of infrared radiation, the exact thickness of the film is not particularly important. However, if the film is too thick, it may have a reverse effect by decreasing the temperature due to the low thermal conductivity of dielectric film.

The choice of film deposited depends on the cost and ease of the deposition. Particularly preferred are oxide films because they are easily deposited, heated, and patterned and do not have to be removed. Other preferred films are nitrides, metals, silicon, carbon, silicon carbide, or mixtures thereof Carbon and silicon carbide films produce the best emissivity, being close to 1.

Heating may be performed with a rapid thermal processor (RTP), such as a rapid thermal annealer (RTA), or a furnace. An RTP is preferred because it heats in a short time period, where higher temperature differentials may be achieved. In a furnace, over long periods of time, the temperature differential will decrease and eventually reach 0.

Figure 6:
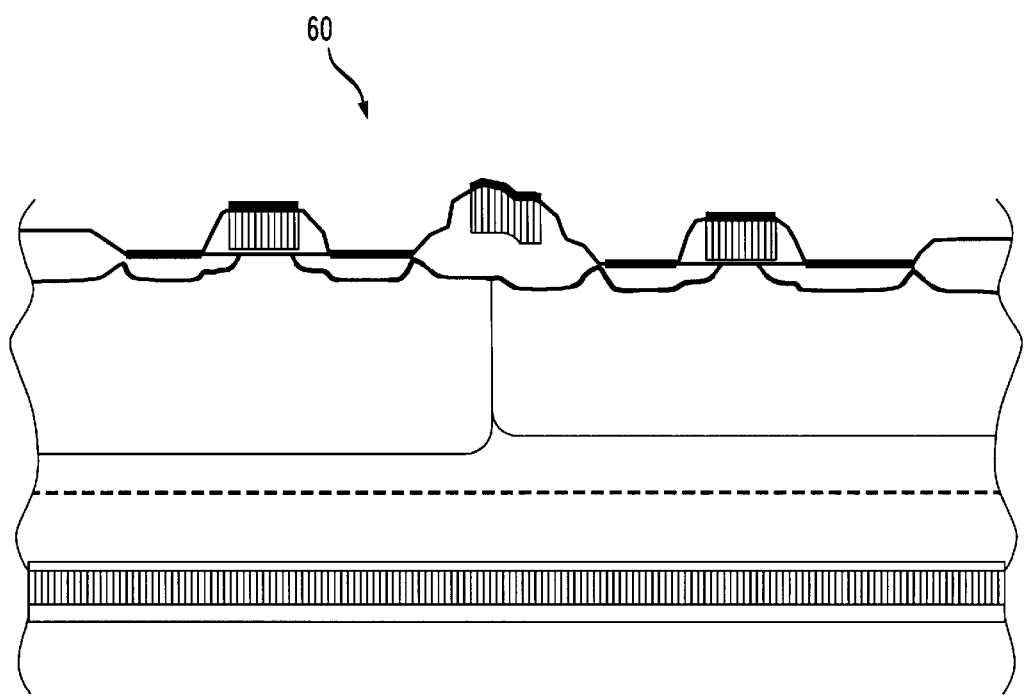
FIG. 6 is a schematic cross-sectional view of a portion of the integrated circuit shown in FIG. 3 where the unreacted product is etched.

These methods may also include the further step of removing the film from the surface. Alternatively, if a residual photoresist and a reacted product are formed on the wafer, the method may include the further steps of stripping the residual photoresist from the wafer; and etching the unreacted product from the wafer. The etched wafer 60 is shown in FIG. 6.

WORKING EXAMPLE

In one experiment, the reaction of Ti and Si forming $TiSi_2$, or self-aligning titanium silicide, was examined. A wafer having exposed surfaces of Si was provided. After deposition of titanium, which is a metal of low emissivity, the titanium was coated with an oxide film of 1000 Å to improve the heat flow. The silicide was selectively formed by a rapid thermal process, in this case, a rapid thermal annealer having a heating lamp and a processing chamber, at a reaction temperature of 650° C. A pyrometer of a closed loop temperature control system sensed an average wafer temperature to control the heating lamp. In this process, the temperature must be comparatively high to achieve complete silicidation on silicon, but as low as possible to avoid any reaction with $SiO_2$. The amount of $TiSi_2$ formed with the presence ofthe oxide film indicated a temperature differential of 20° C. which is consistent with the prior set of calculations. Typically, this method is followed by etching the titanium with a wet etch.

The above steps may be repeated any number of times.

While the invention has been described with specificity, additional advantages and modifications will readily occur to those skilled in the art. Therefore, the invention in its broader aspects is not limited to the specific details shown and described herein. Accordingly, various modifications may be made without departing from the spirit or scope of the general inventive concept as defined by the appended claims and their equivalents. For example, different layers of film may be applied to different areas to produce different reactions, or other different processes, at different times, or during one single heating process.

What is claimed is:

1. A method of manufacturing an integrated circuit comprising:
   a. providing a wafer having a surface;
   b. altering material properties of at least one selected portion of said surface, said at least one portion comprising in total less than all of said surface, to alter heat flow in said portion by depositing at least one layer of film on said portion;
   c. heating said wafer to an elevated temperature to initiate a reaction at said portion;
   d. monitoring said temperature of said wafer to control said heating and terminating said heating when a predetermined period of time has expired.

2. The method of claim 1 wherein said altering material properties causes a temperature differential between a temperature of said portion heated with said film and a temperature of said portion heated without said film.

3. The method of claim 1 wherein said film is deposited by a process selected from the group consisting of low pressure chemical vapor deposition, plasma-enhanced chemical vapor deposition, rapid thermal chemical vapor deposition, sputtering, spin-on-glass, molecular beam epitaxy, physical vapor deposition, and combinations thereof.

4. The method of claim 1 wherein said film comprises at least one material selected from the group consisting of nitrides, oxides, metals, silicon, carbon, silicon carbide, and mixtures thereof.

5. The method of claim 1 wherein said heating step is performed with a rapid thermal processor.

6. The method of claim 1 wherein said heating step is performed with a rapid thermal annealer.

7. The method of claim 1 wherein said heating step is performed with a furnace.

8. The method of claim 1 further comprising:
   e. removing said film from said surface.

9. The method of claim 1 wherein a residual photoresist is formed and an unreacted product remains on said wafer during said heating step.

10. The method of claim 9 further comprising: stripping said residual photoresist from said wafer; and etching said unreacted product from said wafer.

11. The method of claim 1 wherein said reaction comprises a chemical reaction between a plurality of reactants.

12. The method of claim 1 wherein said reaction comprises a physical reaction.

13. The method of claim 1 wherein said reaction comprises annealing at least one selected layer.

14. The method of claim 1 wherein said reaction comprises sintering at least one selected particle with another selected particle.

15. The method of claim 1 wherein said reaction comprises diffusing preferentially at least one selected atom.

16. The method of claim 1 wherein said material properties comprise at least one property selected from the group consisting of emissivity, absorptivity, reflectivity, and combinations thereof.

17. The method of claim 1 wherein said heat flow in said selected portion of said surface is altered relative to remaining portions of said surface.

18. The method of claim 1 wherein a product of said reaction comprises $TiSi_2$.

19. A method of manufacturing an integrated circuit comprising:
   a. providing a wafer having a surface and at least one portion of titanium metal and a section of silicon adjacent to said portion on said surface;
   b. altering material properties of said portion to alter heat flow in said portion by depositing at least one layer of oxide film of about 1000 Å on said portion, whereby said heat flow increases a temperature at said portion by about 20° C.;
   c. placing said wafer in a rapid thermal annealer having at least one heating lamp and a processing chamber;
   d. heating said wafer with said heating lamp at a temperature of about 650° C. to produce a chemical reaction between at least a portion of said titanium metal and said silicon to form $TiSi_2$;
   e. monitoring a temperature of said wafer with a closed loop temperature control system, wherein a pyrometer senses an average wafer temperature in said rapid thermal annealer; and
   f. providing a temperature feedback from said temperature control system to control said heating lamp.

20. The method of claim 19 further comprising:
   g. etching any remaining titanium with a wet etch.

* * * * *